United States Patent [19]

Pfiester

[11] Patent Number: 4,918,510

[45] Date of Patent: Apr. 17, 1990

[54] COMPACT CMOS DEVICE STRUCTURE

[75] Inventor: James R. Pfiester, Austin, Tex.

[73] Assignee: Motorola, Inc., Schaumburg, Ill.

[21] Appl. No.: 264,913

[22] Filed: Oct. 31, 1988

[51] Int. Cl.$^4$ ............................................. H01L 27/02
[52] U.S. Cl. ........................................ 357/42; 357/59;
357/23.6; 357/23.11; 357/41
[58] Field of Search ............... 357/41, 42, 23.6, 23.11,
357/59, 23.7

[56] References Cited

U.S. PATENT DOCUMENTS

| | | | |
|---|---|---|---|
| 4,370,669 | 1/1983 | Donley | 357/23 |
| 4,404,579 | 9/1983 | Leuschner | 357/23 |
| 4,651,408 | 3/1987 | MacElwee | 29/576 |
| 4,654,121 | 3/1987 | Miller et al. | 156/653 |
| 4,710,897 | 12/1987 | Masuoka | 365/182 |
| 4,771,323 | 9/1988 | Saski | 357/23.6 |
| 4,799,097 | 1/1989 | Szluk et al. | 357/42 |

FOREIGN PATENT DOCUMENTS 0008475 1/1979 Japan.

*Primary Examiner*—Martin H. Edlow
*Assistant Examiner*—D. Monin
*Attorney, Agent, or Firm*—John A. Fisher

[57] ABSTRACT

A compact CMOS structure and method for fabricating the structure are disclosed. In one embodiment of the invention the structure includes a P-type surface region in a silicon substrate surrounded by a field oxide which extends, at least in part, above the surface of the substrate. A polycrystalline silicon sidewall frame is formed at the sidewall of the field oxide and a gate insulator is formed over both the polycrystalline silicon frame and the silicon surface region. A common gate electrode is formed which traverses the frame and the surface region. P-type source and drain regions are formed in the polycrystalline silicon frame on opposite sides of the gate electrode and N-type source and drain regions are formed in the surface region on opposite sides of the gate electrode.

11 Claims, 4 Drawing Sheets

4,918,510

1

COMPACT CMOS DEVICE STRUCTURE

BACKGROUND OF THE INVENTION

This invention relates generally to CMOS devices, and more specifically to CMOS structures combining polycrystalline silicon and monocrystalline silicon device.

As MOS circuits become more complex and include more and more devices, it becomes necessary to develop new structures and circuit techniques which minimize the overall size of the fabricated circuit. One such technique for reducing the physical size of a manufactured circuit is to fabricate some of the devices, and generally the load devices, in a overlying layer of semiconductor material. Devices have been fabricated, for example, in which load resistors or MOS load devices have been fabricated in a second, overlying polycrystalline silicon layer.

The manufacture of complex integrated circuits also requires a process which is both high yielding and highly reliable. Such a process is best achieved by minimizing the number of processing steps and by using process steps which are known and well established. Although the need for three dimensional structures in which devices are made in an overlying semiconductor layer are desirable, the proposed structures have not been entirely satisfactory in terms of manufacturability. Additionally, the available structures have not been satisfactory in terms of device characteristics achieved.

Accordingly, a need existed for an improved structure which was both manufacturable and which provided the compactness necessary for complex integrated circuits.

It is therefore an object of this invention to provide an improved CMOS structure having an MOS transistor formed in an overlying layer of semiconductor material.

It is a further object of this invention to provide an improved and compact CMOS inverter structure.

It is another object of this invention to provide an improved CMOS SRAM cell.

It is yet another object of this invention to provide an improved process for fabricating a multiple layer CMOS structure.

BRIEF SUMMARY OF THE INVENTION

The foregoing and other objects and advantages of the invention are achieved with a CMOS structure having one conductivity type device formed in the semiconductor substrate and an opposite conductivity type device formed in an overlying semiconductor material layer. In accordance with one embodiment of the invention, a semiconductor substrate is provided which has a surface region of P-type conductivity. A field isolation region having a peripheral edge extending in part above the semiconductor surface is formed to surround an isolated portion of the surface. A polycrystalline silicon frame is formed on the peripheral edge of the field isolation to also surround the portion of surface. A gate insulator is formed over the surface of the substrate and over the polycrystalline silicon frame. A single gate electrode is then formed overlying both the polycrystalline silicon frame and the surrounded portion of silicon substrate. N-type source and drain regions are formed in the substrate on opposite sides of the overlying gate electrode and P-type source and drain regions are formed in the polycrystalline silicon frame

2 on opposite sides of the gate elecrtrode. An inverter is then completed by coupling one of the N-type source and drain regions to one of the P-type polycrystalline silicon source and drain regions.

Figure 10:
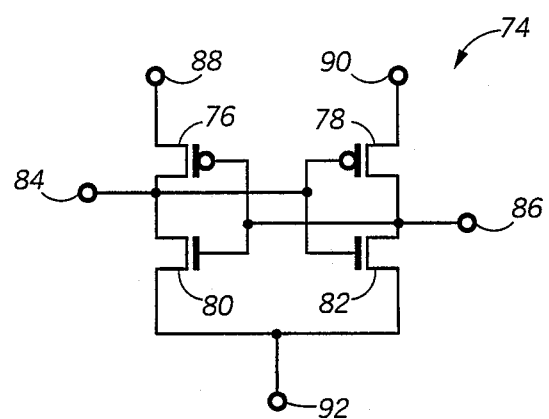
FIG. 10 illustrates schematically a CMOS SRAM using P-channel load transistors fabricated in accordance with the invention.
Figure 11:
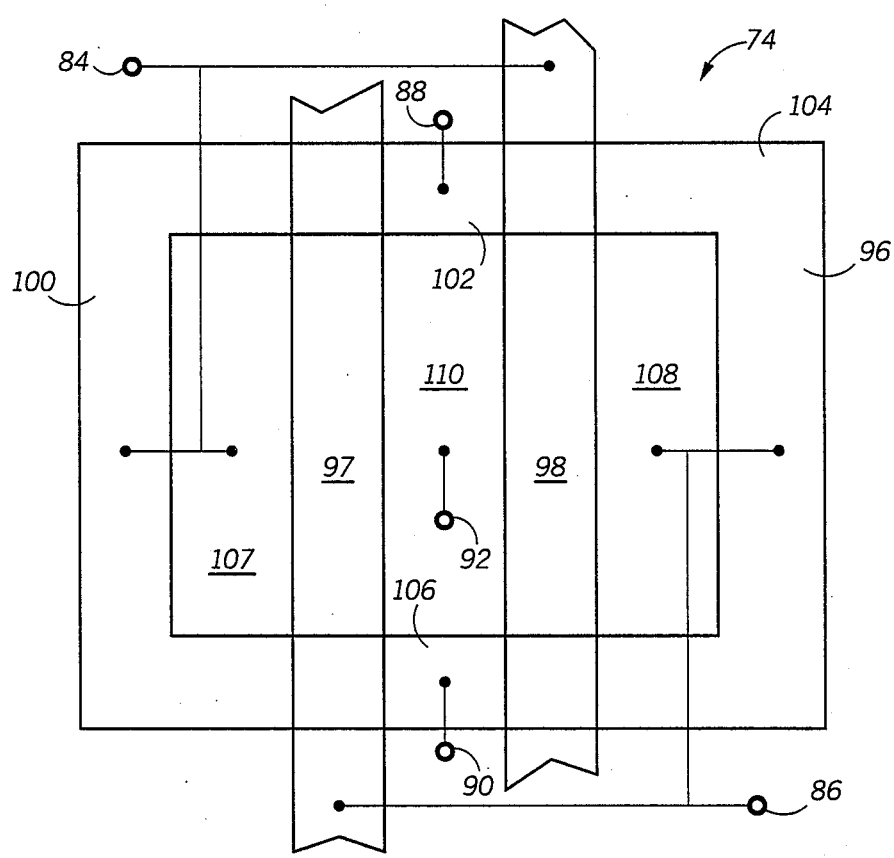

And, FIG. 11 illustrates, in plan view, one embodiment of a SRAM cell utilizing the invention and implementing the cell illustrated in FIG. 10.

DETAILED DESCRIPTION OF PREFERRED EMBODIMENTS

Figure 1:
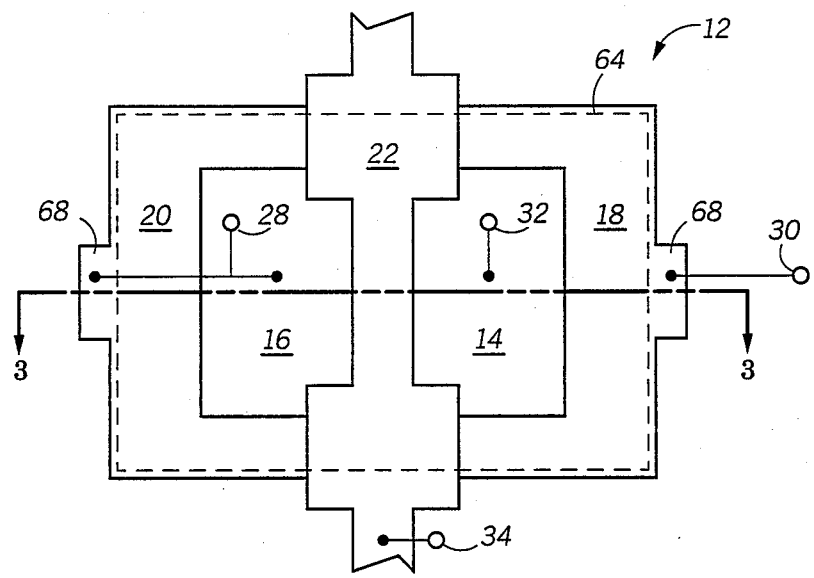
FIG. 1 illustrates, in plan view, a CMOS inverter fabricated in accordance with the invention.

FIG. 1 illustrates, in plan view, a CMOS inverter utilizing a polycrystalline silicon P-channel load transistor in accordance with one embodiment of the invention. This structure, which will described further below, includes an N-channel transistor fabricated in a semiconductor substrate and a P-channel transistor (actually two transistors in parallel) fabricated in an overlying layer of polycrystalline silicon. The N-channel transistor includes a source region 14 and a drain region 16. The P-channel transistors includes a P+ source region 18 and a P+ drain region 20. A gate electrode 22 overlies the channels of all three transistors and is insulatively spaced away from those channels.

Figure 2:
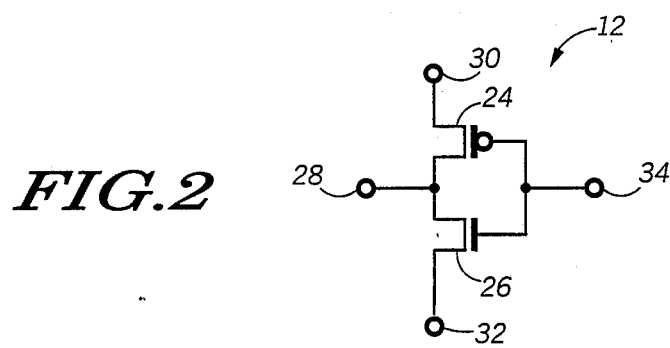
FIG. 2 illustrates, in schematic form, the circuit implemented with the structure of FIG. 1.

The circuit implementation of inverter 12 is illustrated in FIG. 2. The inverter includes P-channel transistors 24 and 25 and an N-channel transistor 26 having a common output 28. The source of P-channel transistors 24 and 25 is coupled to a supply electrode 30 and the source of N-channel transistor 26 is coupled to a voltage supply 32. The common gates of the three transistors are coupled to gate electrode 34. These electrodes are also indicated schematically on the structure shown in FIG. 1.

FIGS. 3-9 illustrates the various process steps utilized in fabricating a device structure such as that illustrated in FIG. 1. These process steps illustrate the fabrication of a CMOS device having a N-channel transistor formed in a silicon substrate and having a P-channel device formed in a overlying polycrystalline silicon layer. The device can also be fabricated, of course, with the device types reversed and can be fabricated in other semiconductor material or with a combination of semiconductor materials such as silicon substrate and an overlying layer of a different semiconductor material.

Figure 3:
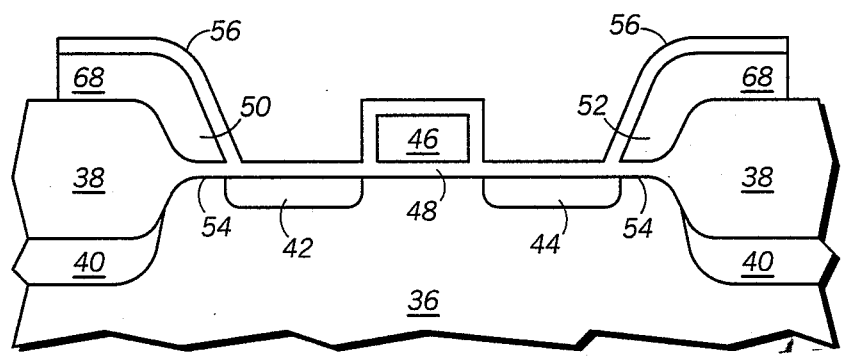
FIGS. 3-9 illustrate various aspects of the process of the invention used in fabricating a device such as that illustrated in FIG. 1.

FIG. 3 illustrates a cross-section through the structure of FIG. 1 at the location indicated. The portions of the CMOS device illustrated include a silicon substrate, having at least a surface region 36 of P-type conductivity. A field insulator 38 divides the semiconductor substrate into isolated device regions. Preferably field insulator 38 is a thermally grown silicon dioxide which is partially recessed into the silicon substrate and which, at least in part, extends above the original surface. To increase the electrical isolation between adjacent devices, a channel stop region 40 of increased P-type conductivity is located beneath field insulator 38. The channel stop region and field insulation are easily fabricated using conventional process techniques. The N-channel transistor portion of the illustrated circuit structure includes a drain region 42 and a source region 44 which are of N-type conductivity. A gate electrode 46 overlies the channel region between the source and drain regions and is electrically isolated from the channel region by a gate insulator 48 which is preferably a thermally grown silicon dioxide. The P-channel transistor, only a portion of which is illustrated in this cross-section, includes a drain region 50 and a source region 52. The source and drain regions are formed in a frame of polycrystalline silicon which is formed on the sidewall of the field isolation 38. In this embodiment the frame of polycrystalline silicon surrounds the surface portion of semiconductor substrate 36. The source and drain regions of the P-channel polycrystalline silicon transistor are isolated from the P-type silicon substrate by an oxide 54 which overlies the surface of substrate 36. Additionally, a gate insulator 56 overlies the top surface of the polycrystalline silicon and especially that portion of the polycrystalline silicon which forms the channel of the P-channel transistor. Although not illustrated in this cross-section, gate electrode 46 also overlies the channel of the P-channel transistor, is isolated from the channel by gate insulator 56, and forms the common gate electrode of both transistors.

Figure 4:
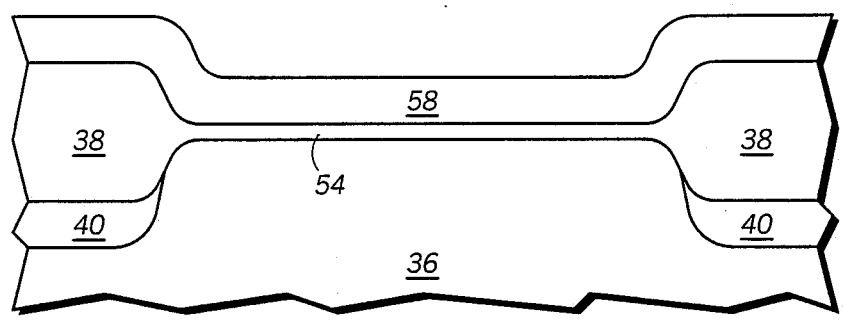

FIG. 4 illustrates the initial process steps used in fabricating the device illustrated in FIG. 3. The early steps in the process include the formation of the channel stop regions 40 and field insulation 38. These are formed by conventional steps which are well known. Although illustrated with a LOCOS structure, the device can also be implemented with other common isolation techniques. The surface of P-type surface region 36 is oxidized to form a thin silicon oxide layer 54. This can have, for example, a thickness of several tens of nanometers. A layer of polycrystalline silicon 58 is then deposited overlying oxide layer 54 by a chemical vapor deposition or other deposition technique. Layer 58 preferably has a thickness of about 100–400 nanometers. Polycrystalline silicon layer 58 is doped to the appropriate N-type doping concentration to provide the desired channel doping of the P-channel transistor. The doping can be supplied by adding arsenic or phosphorus to the gas flow during the chemical vapor deposition. Alternatively, the polycrystalline silicon can be deposited as an undoped layer which is subsequently doped by ion implantation or other doping technique. Preferably the polycrystalline silicon is doped to about $10^{17}$ cm$^{-3}$ to achieve a threshold voltage magnitude of about 1 volt. Preferably the polycrystalline silicon is annealed at a high temperature of about 1000°–1100° C., either before or after the doping if a post deposition doping is used, to achieve optimum crystalline properties and the attendant high mobility.

Figure 5:
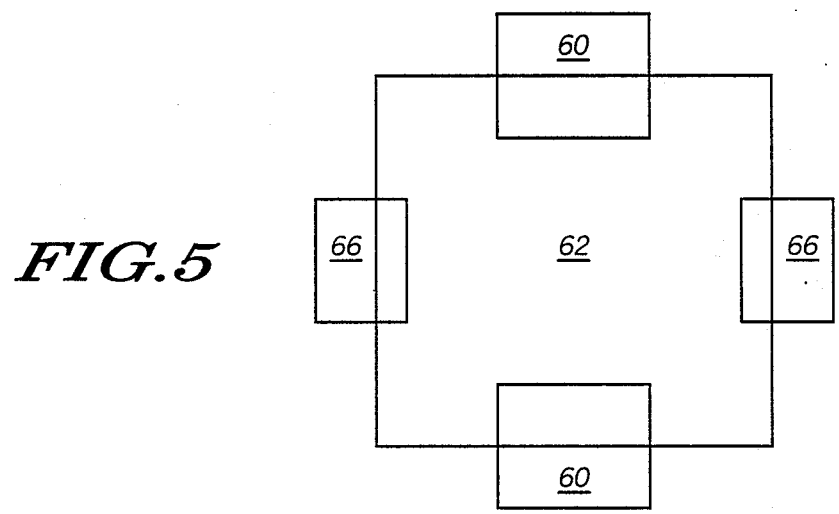

FIG. 5 illustrates a composite mask which is used in subsequent photolithographic masking operations. A layer of photoresist is applied overlying the structure illustrated in FIG. 4. This photoresist layer is patterned to leave photoresist as illustrated by the rectangles 60 shown in FIG. 5. Rectangles 60 are shown relative to the edge of the field insulation illustrated by the line 62 in FIG. 5 and in FIG. 1 by the dashed line 64. With photoresist pattern 60 in place, the polycrystalline silicon is implanted with a heavy dose of boron (or BF$_2$) to achieve the desired source and drain doping in the polycrystalline silicon layer 58. A dose of about $1-2 \times 10^{16}$ cm$^{-2}$ will insure that the subsequent doping of the N-channel source and drain regions will not overdope the P-channel source and drain regions in the first polycrystalline silicon layer.

After ion implanting the polycrystalline silicon to dope the P-channel source and drain regions, the photoresist ion implantation mask is stripped from the structure and a second layer of photoresist is applied and patterned using the pattern in FIG. 5 illustrated by the rectangles 66. The photoresist pattern 66 is used with an anisotropic etching process such as reactive ion etching to achieve a pattern of polycrystalline silicon which includes a sidewall frame of polycrystalline silicon around the vertical edge of the field oxide extending above the surface of substrate 36 together with optional tabs 68 illustrated in both FIGS. 1 and 3. The tabs are joined to the frame and provide an easy means for contacting the polycrystalline silicon frame. Alternatively, contact to the frame can be achieved by other means such as a localized silicide interconnect formed later in the process (not shown). The frame portion of the pattern is formed in self-aligned fashion by the reactive ion etch process itself and does not require a photoresist mask. Only the tabs require the use of the photoresist mask. A subsequent masked etching process can be used to remove the polycrystalline silicon from those portions of the circuit in which a polycrystalline sidewall frame is not necessary. This includes the peripheral portions of the integrated circuit which do not require P-channel transistors formed in an overlying polycrystalline silicon layer.

Figure 6:
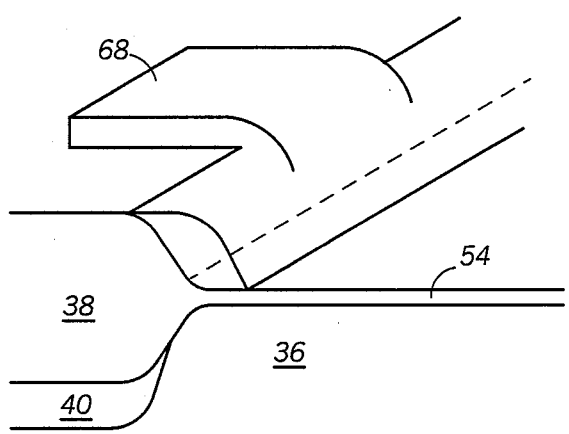

The patterned polycrystalline silicon frame with the attached contact tabs is illustrated in FIG. 6. As illustrated in this embodiment, the polycrystalline silicon frame is a rectangular shape, but it is not intended that the frame be limited to rectangles.

Figure 7:
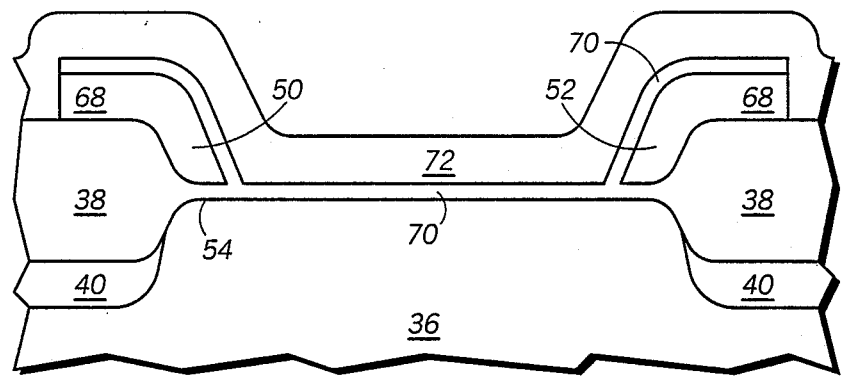

The process in accordance with the invention continues with the removal of the exposed portions of oxide layer 54 and the regrowth of a clean gate oxide 70 as illustrated in FIG. 7. Although the original oxide 54 could be used as a gate oxide, it is preferable to remove this oxide which may have been contaminated or damaged by earlier processing steps and to replace it with a clean, contaminate-free, high quality thermal gate oxide. Oxide 70 also grows on the patterned polycrystalline silicon and forms the gate oxide of the polycrystalline silicon P-channel transistor. A second layer of polycrystalline silicon 72 is then deposited overlying gate oxide 70. Polycrystalline silicon layer 72 is preferably deposited by chemical vapor deposition and may be either in situ doped to N-type conductivity or deposited undoped and doped N-type during the subsequent doping of the source and drain regions of the N-channel transistor.

Figure 8:
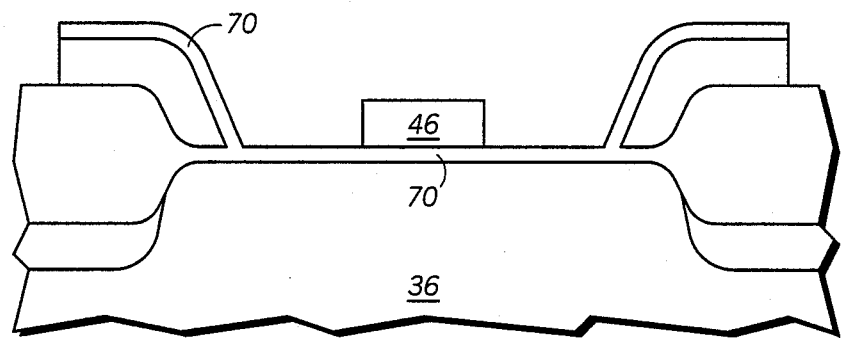

As illustrated in FIG. 8, polycrystalline silicon layer 72 is patterned to form gate electrode 46 of the CMOS structure. Although not shown in this cross-section, as explained above, gate electrode 46 serves as both the gate electrode for the N-channel transistor to be formed and for the P-channel transistor. Gate electrode 46 is separated from the channel of the P-channel transistor by gate oxide 70 which also grows on the frame and tabs of polycrystalline silicon. The gate electrode 46 is not self-aligned with respect to the channel of the P-channel transistor. Accordingly, it is desirable to widen the gate electrode as it crosses over the channel of the P-channel transistor as illustrated in FIG. 1. The wide gate electrode allows for misalignment and insures that all of the channel of the P-channel transistor is overlaid by the gate electrode. The thermally grown gate oxide 70 grows more rapidly over the heavily doped P+ source and drain regions than over the more lightly doped channel region so that the overlap capacitance is minimized. This reduces the penalty of high capacitance usually encountered with a non-self aligned device.

Figure 9:
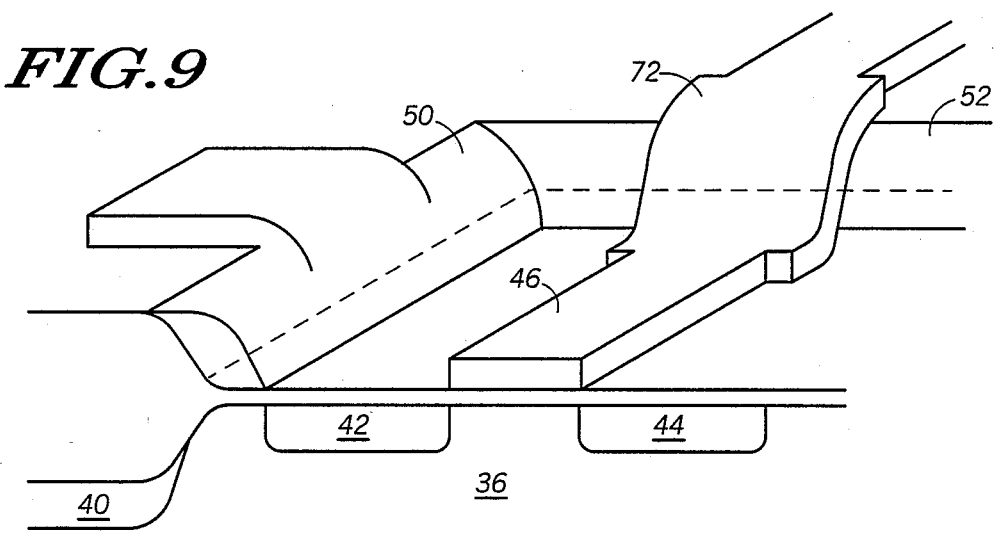

The process is completed by ion implanting source and drain regions 42 and 44 as illustrated in FIG. 3. These are N-type regions which are self-aligned with gate electrode 46. The source and drain regions are formed by ion implantation of an N-type dopant such as arsenic to a dose of about $5 \times 10^{15}$ cm$^{-2}$. This N-type dopant is also implanted into the source and drain of the P-channel transistor, but the source and drain of the polycrystalline silicon transistor were doped to a sufficiently high boron concentration that the boron is not over compensated by this subsequent arsenic implantation. As illustrated in FIG. 3, the source and drain regions 42 and 44 are offset from the edge of field oxide 38 and channel stop 40 by width of the polycrystalline silicon frame. This results in a higher breakdown voltage for the diodes formed at the intersection between the source or drain and the P-type substrate 36. This also reduces the encroachment of the field dopant from regions 40 into the active area of the device. FIG. 9 illustrates the relationship of gate electrode 46 to the N-channel source and drain regions 42 and 44 and to the P-channel source and drain regions 50 and 52. The broadened portion 72 of gate electrode 46 overlies the channel of the P-channel transistor.

The invention has been discussed with reference to a simple CMOS inverter circuit. The invention is also readily applicable to other structures which benefit from a P-channel polycrystalline silicon transistor in combination with a more conventional N-channel transistor formed in a silicon substrate. For example, the compact layout achievable in accordance with the invention is beneficial in the design and fabrication of a static RAM (SRAM) cell such as that illustrated in FIG. 10. SRAM cell 74 is a conventional cell including P-channel transistors 76 and 78 coupled in series with N-channel transistors 80 and 82, respectively. The common node between transistors 76 and 80 is coupled to the common gate of transistor 78 and 82. In similar manner, the common node between transistor 78 and 82 is coupled to the common gate of transistors 76 and 80. The complementary outputs of the device are available at terminals 84 and 86. The sources of P-channel transistors 76 and 78 are coupled to a supply through terminals 88 and 90, respectively. Similarly, the sources of transistors 80 and 82 are coupled to a second voltage supply through common terminal 92.

FIG. 11 illustrates, in accordance with the invention, how the circuit of FIG. 10 is implemented in accordance with the invention. FIG. 11 illustrates, in plan view, a CMOS structure which includes a polycrystalline silicon frame layer 96 which surrounds a P-type surface region at the surface of a silicon substrate. Gate electrodes 97 and 98 traverse both the surface of the silicon substrate portion and polycrystalline silicon frame 96 and form the common gate electrodes of transistors 76, 80 and 78, 82, respectively. The polycrystalline silicon frame is doped P-type to form the drain 100 of transistor 76, the source 102 of transistor 76, the drain 104 of transistor 78, and the source 106 of transistor 78. Underlying gate electrodes 97 and 98 are N-type regions of the polycrystalline silicon ring which form the channels of P-channel transistors 76 and 78. Formed in the surface of the P-type silicon substrate are N+ regions which form the drain 107 of transistor 80, the drain 108 of transistor 82 and the common source 110 of transistors 80 and 82. The appropriate circuit interconnections and terminal designations have been indicated on FIG. 11 in correspondence to those found in FIG. 10. Electrodes 88 and 90 can, of course, be coupled together to form a common supply terminal. The implementation of FIG. 11 also forms transistors 77 and 79 as indicated in FIG. 10.

Thus it is apparent that there has been provided, in accordance with the invention, a compact CMOS device structure and method for its fabrication which fully meet the objects and advantages set forth above. Although the application has been described and illustrated with reference to specific embodiments thereof, it is not intended that the invention be limited to those illustrative embodiments. Those skilled in the art will appreciate that variations and modifications can be made without departing from the spirit of the invention. For example, the particular shape of certain device regions can be modified. Additionally, the insulators described can generally be selected from oxides, nitrides, and the like. Other dopant concentrations can be employed and the dopants can be introduced by thermal diffusion, from spin-on glass sources, and the like in addition to the described use of ion implantation. Accordingly, it is intended to encompass within the invention all such modifications and variations as fall within the scope of the appended claims.

What is claimed is:

1. A CMOS structure comprising:
   a semiconductor substrate having a surface and a surface region of P-type conductivity at said surface;
   field isolation at said surface, extending, at least in part, above said surface and having a peripheral edge surrounding said surface region;
   a first layer of polycrystalline silicon forming a frame abutting and interior to said peripheral edge and overlying said surface region;
   a first layer of insulating material overlying said surface region;
   a second layer of patterned polycrystalline silicon overlying said first layer of insulating material, traversing said surface region, and insulatively separated from said first layer of polycrystalline silicon by a second layer of insulating material;
   N-type source and drain regions formed in portions of said surface region not overlaid by said second layer of patterned polycrystalline silicon;
   and P-type source and drain regions formed in said first layer of polycrystalline silicon on opposite sides of said first layer of patterned polycrystalline silicon.

2. The CMOS structure of claim 1 wherein said second layer of patterned polycrystalline silicon comprises a gate electrode of a first N-channel transistor and of a second P-channel transistor.

3. The CMOS structure of claim 1 wherein said second layer of patterned polycrystalline silicon comprises first and second strips of polycrystalline silicon traversing said surface region and wherein said N-type source and drain regions comprise first, second and third N-type regions separated by said first and second strips.

4. The CMOS structure of claim 3 further comprising means for coupling one of said P-type source and drain regions to said first N-type region and to said second strip; and means for coupling the other of said P type source and drain regions to said third N-type region and to said first strip.

5. The CMOS structure of claim 1 further comprising: a p-type region underlying said field isolation and spaced from said N-type source and drain regions.

6. A CMOS structure comprising:
   a silicon substrate of first conductivity type;
   a field oxide surrounding a portion of said substrate at the surface thereof;
   a strip of polycrystalline silicon abutting said field oxide and spaced above said substrate;
   a first gate oxide overlying said substrate;
   a second gate oxide overlying said strip of polycrystalline silicon;
   a second layer of polycrystalline silicon selectively overlying said first and second gate oxides;
   source and drain regions of first conductivity type formed in said strip of polycrystalline silicon on each side of said second layer of polycrystalline silicon;
   and source and drain regions of second conductivity type formed in substrate at opposite sides of said second layer of polycrystalline silicon.

7. The CMOS structure of claim 6 wherein said strip of polycrystalline silicon surrounds said portion of said substrate.

8. The CMOS structure of claim 6 wherein said second layer of polycrystalline silicon comprises an elongate pattern of polycrystalline silicon traversing said portion of said substrate and said strip of polycrystalline silicon.

9. The CMOS structure of claim 6 wherein said second layer of polycrystalline silicon comprises two electrically unconnected elongate patterns of polycrystalline silicon traversing said portion of said substrate and said strip of polycrystalline silicon.

10. A CMOS device comprising:
    a silicon substrate having a P-type surface region;
    field oxide surrounding and extending above said surface region;
    a polycrystalline silicon frame formed on the sidewall of said field oxide and insulatively separated from said surface region;
    a polycrystalline silicon gate electrode traversing said surface region and said frame and spaced from said surface region by a first gate insulator and from said frame by a second gate insulator;
    N-type source and drain regions formed in said surface region at opposite sides of said gate electrode;
    P-type source and drain regions formed in said frame at opposite sides of said gate electrode;
    means for coupling one of said N-type source and drain regions to one of said P-type source and drain regions.

11. The CMOS device of claim 10 further comprising a P-doped region of higher doping concentration than said surface region underlying said field oxide and spaced away from said N-type source and drain regions.

* * * * *